United States Patent
Shin et al.

(10) Patent No.: US 8,128,852 B2
(45) Date of Patent: Mar. 6, 2012

(54) MANUFACTURING PROCESS FOR SILICONE GLASS CONCENTRATOR LENS

(75) Inventors: Hwa-Yuh Shin, Taoyuan (TW); Yann-Mou Shyu, Taoyuan (TW); Chun-Yi Chen, Taoyuan (TW); Hung-Zen Kuo, Taoyuan (TW); Yi-Ya Huang, Taoyuan (TW)

(73) Assignee: Institute of Nuclear Energy Research, Atomic Energy Council, Executive Yuan, Longtan Township, Taoyuan County (TW)

( * ) Notice: Subject to any disclaimer, the term of this patent is extended or adjusted under 35 U.S.C. 154(b) by 0 days.

(21) Appl. No.: 12/776,343

(22) Filed: May 7, 2010

(65) Prior Publication Data

US 2011/0174018 A1 Jul. 21, 2011

(30) Foreign Application Priority Data

Jan. 15, 2010 (TW) .................. 99101075 A

(51) Int. Cl.
*B29C 33/40* (2006.01)

(52) U.S. Cl. .......................................... 264/225; 65/210
(58) Field of Classification Search .................. 264/225; 128/845; 65/210
See application file for complete search history.

(56) References Cited

U.S. PATENT DOCUMENTS

2003/0095340 A1* 5/2003 Atwater et al. ............... 359/742
* cited by examiner

*Primary Examiner* — Yogendra Gupta
*Assistant Examiner* — John Robitaille
(74) *Attorney, Agent, or Firm* — Cheng-Ju Chiang

(57) ABSTRACT

A manufacturing process of silicone glass concentrator lens, wherein, a mold is provided with a material inlet hole and an air outlet hole that are respectively used for pouring in liquid silicone and exiting air respectively. Wherein, firstly, the mold is connected to a glass carrier plate in a vertical arrangement, then pouring the liquid silicone into the mold through the material inlet hole, thus exiting the excessive air through the air outlet hole of the mold automatically. Through the application of this manufacturing process, a bubble-free silicone glass concentrator lens can be made in a fast manner without the occurrences of liquid silicone overflow, hereby reducing the production cost.

7 Claims, 7 Drawing Sheets

MANUFACTURING PROCESS FOR SILICONE GLASS CONCENTRATOR LENS

BACKGROUND OF THE INVENTION

1. Field of the Invention

The present invention relates to a concentrator type solar cell module, and in particular to a manufacturing process for silicone glass concentrator lens.

2. The Prior Arts

Presently, among the energy regeneration systems, the high concentrated photovoltaic (HCPV) electricity generation system has excellent potential for further development, due to its various advantages of material saving, reduced cost and high efficiency in generating electricity. As such, it is generally considered as ideal to be used in building solar energy power plant, thus it has a promising future in the solar energy industry.

Refer to FIG. 1 for a schematic diagram of a concentrator type solar cell module according to the prior art. As shown in FIG. 1, the concentrator type solar cell module 50 mainly includes: a concentrator lens 10, a solar cell 20, and a heat dissipation seat 30. Upon being irradiated by sunlight, the concentrator lens 10 will gather and concentrate sunlight energy onto the solar cell 20, so as to generate electricity for outputting it to the various equipment as required, and the heat produced in this process is dissipated through a heat dissipation seat 30. In this way, the number of solar cells utilized can be decreased, hereby reducing the cost.

In order to produce a high-temperature and sever-weather resistant concentrator lens 10, a glass carrier plate 11 made of glass material is utilized, and a silicone lens 12 is disposed underneath the glass carrier plate 11. Refer to FIGS. 2A~2C for schematic diagrams relating to the steps of manufacturing silicone glass concentrator lens of a concentrator type solar cell module according to the prior art, wherein, the manufacturing process of the concentrator lens 10 of the prior art includes the following steps in sequence: firstly, filling the liquid silicone 13 into a mold 40 to its full; next, disposing and pressing a glass carrier plate 11 on the surface of the mold 40; then waiting for the liquid silicone 13 to dry up to mold to become a silicone lens 12; and finally taking off the mold 40, thus obtaining a silicone glass concentrator lens 10. However, in the manufacturing process mentioned above, in the step of filling in the liquid silicone 13 and pressing on the glass carrier plate 11, bubbles are liable to form in the liquid silicone 13, meanwhile the liquid silicone 13 tends to overflow, such that the production cost of the silicone glass concentrator lens 10 is rather high, also its manufacturing is time consuming. Therefore, presently, the manufacturing process of the silicone glass concentrator lens has much room for improving.

In view of the problems and shortcomings of the prior art, the present invention provides a manufacturing process of silicone glass concentrator lens, so as to solve the aforementioned problems of the prior art.

SUMMARY OF THE INVENTION

A major objective of the present invention is to provide a manufacturing process of silicone glass concentrator lens, wherein, the mold utilized is designed to have a material inlet hole and an air outlet hole, and the mold and glass carrier plate are disposed vertically to each other, such that when liquid silicone is poured into a mold, the excessive air will be exited automatically. As such, not only the occurrences of bubbles are reduced, the overflow of liquid silicone is prevented, but the manufacturing efficiency is also raised, and the production cost can be reduced, hereby overcoming the shortcomings of the prior art In order to achieve the above-mentioned objective, the present invention provides a manufacturing process of silicone glass concentrator lens, wherein, the mold utilized is provided with a material inlet hole and an air outlet hole, the mold is made to contact with the glass carrier plate to form a mold cavity space, and the mold and glass carrier plate are disposed in a vertical arrangement; then, the liquid silicone is poured into the mold through the material inlet hole, so as to make the liquid silicone fill up the mold cavity space, such that the excessive air will be exited through the air outlet hole, thus air bubble and silicone overflow will not occur; finally, waiting for the liquid silicone to dry up into mold, and then taking off the mold, thus realizing the bubble-free silicone glass concentrator lens.

Further scope of the applicability of the present invention will become apparent from the detailed description given hereinafter. However, it should be understood that the detailed description and specific examples, while indicating preferred embodiments of the present invention, are given by way of illustration only, since various changes and modifications within the spirit and scope of the present invention will become apparent to those skilled in the art from this detailed description.

BRIEF DESCRIPTION OF THE DRAWINGS

The related drawings in connection with the detailed description of the present invention to be made later are described briefly as follows, in which.

DETAILED DESCRIPTION OF THE PREFERRED EMBODIMENT

The purpose, construction, features, functions and advantages of the present invention can be appreciated and understood more thoroughly through the following detailed description with reference to the attached drawings.

Figure 3A:
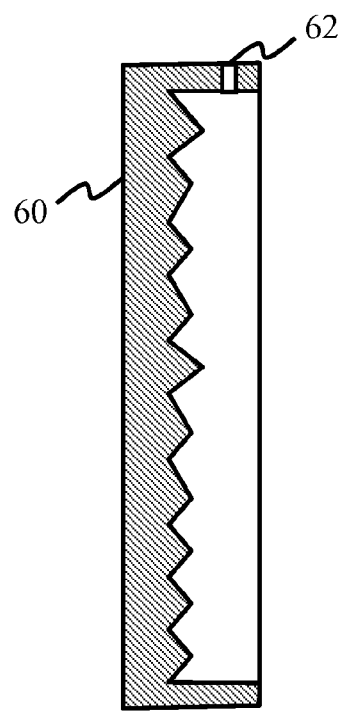
FIGS. 3A and 3B are the side cross section view and front cross section view respectively of a mold utilized in silicone glass concentrator lens manufacturing process according to an embodiment of the present invention.
Figure 3B:
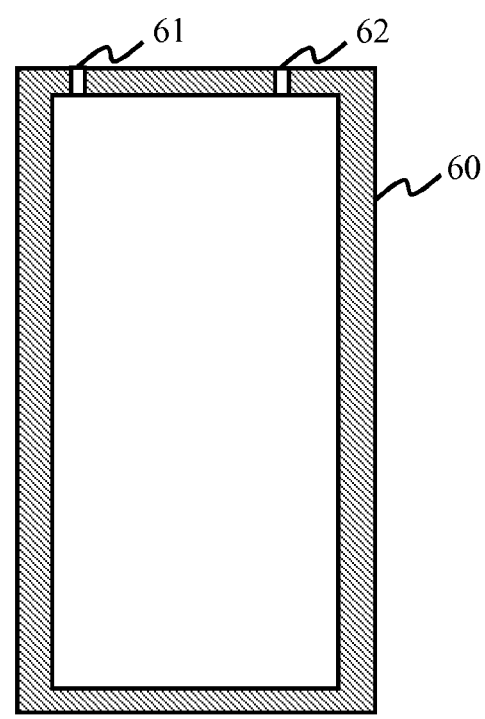
Figure 3C:
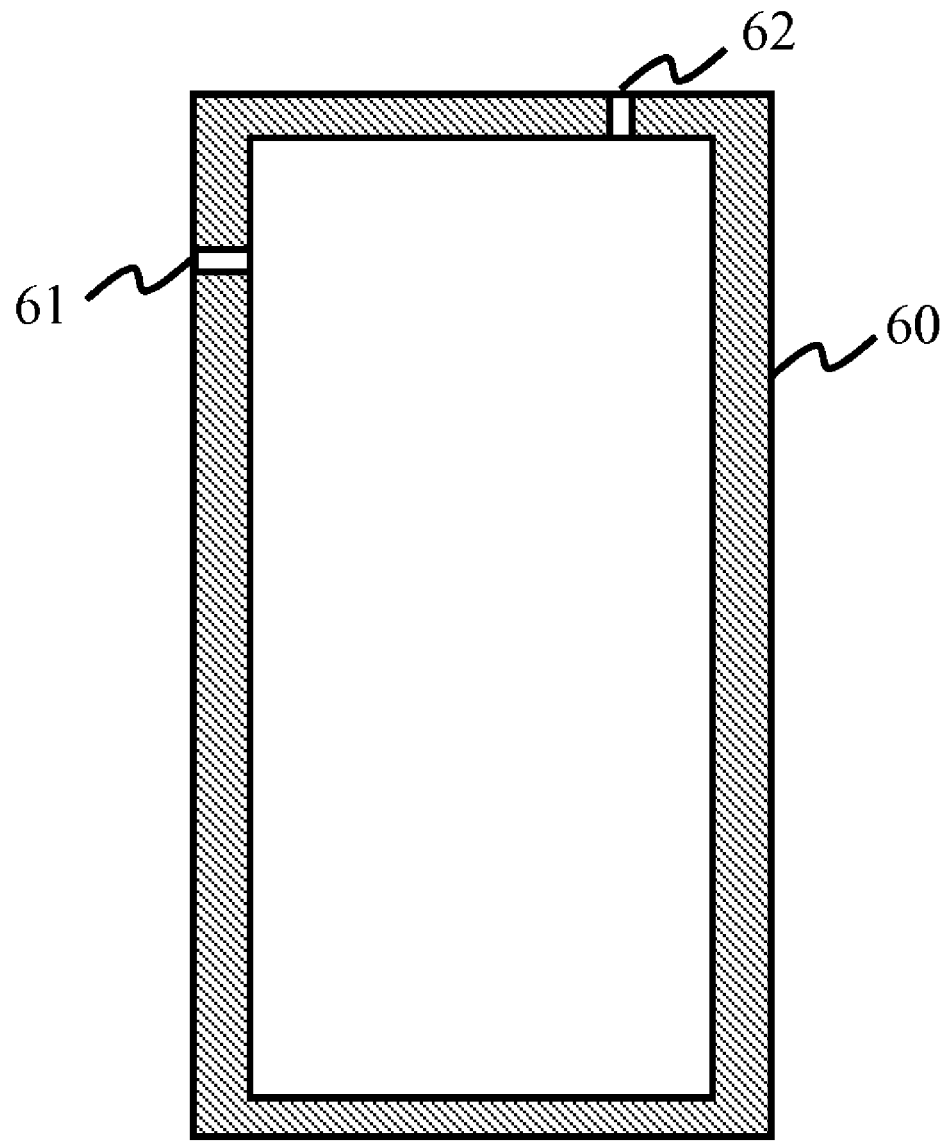
FIG. 3C is a front cross section view of a mold utilized in silicone glass concentrator lens manufacturing process according to another embodiment of the present invention.

Refer to FIGS. 3A and 3B for the side cross section view and front cross section view respectively of a mold utilized in silicone glass concentrator lens manufacturing process according to an embodiment of the present invention. As shown in FIGS. 3A & 3B, a mold 60 is provided with a material inlet hole 61 and an air outlet hole 62, that are used respectively for pouring in liquid silicone and exiting air. The material inlet hole 61 and the air outlet hole 62 are located in the upper portion of the mold 60, however, in actual application, the material inlet hole 61 is not limited to be located on the upper portion of the mold 60, it can also be located on a side of the mold 60, as shown in FIG. 3C.

Figure 1:
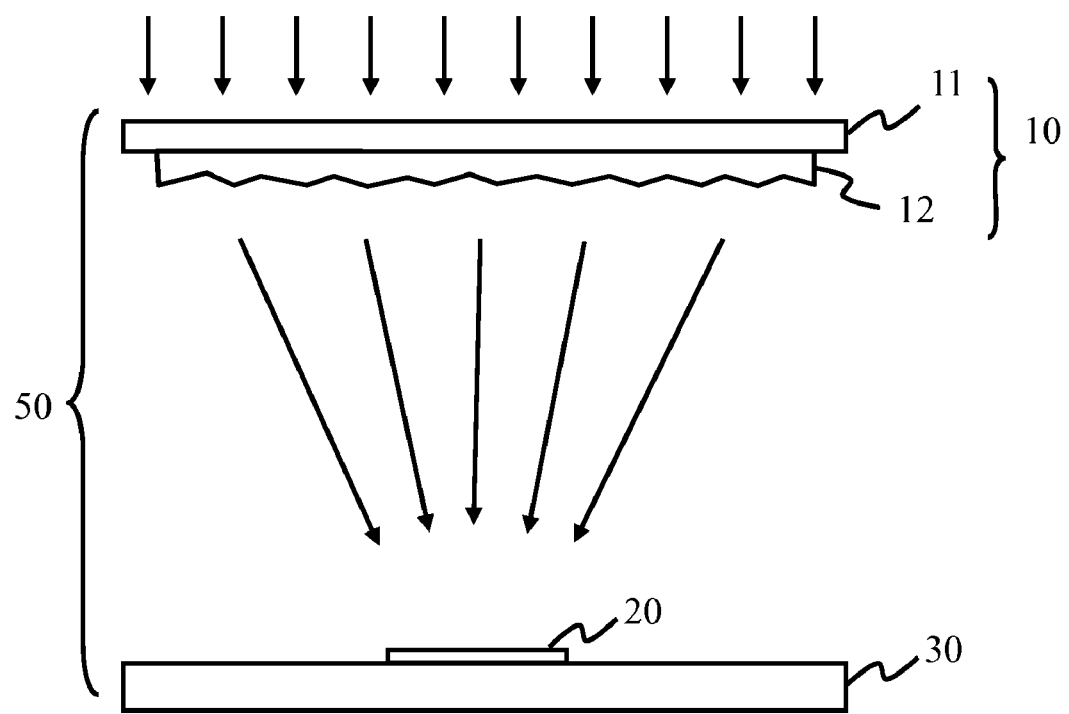
FIG. 1 is a schematic diagram of a concentrator type solar cell module according to the prior art.
Figure 2A:
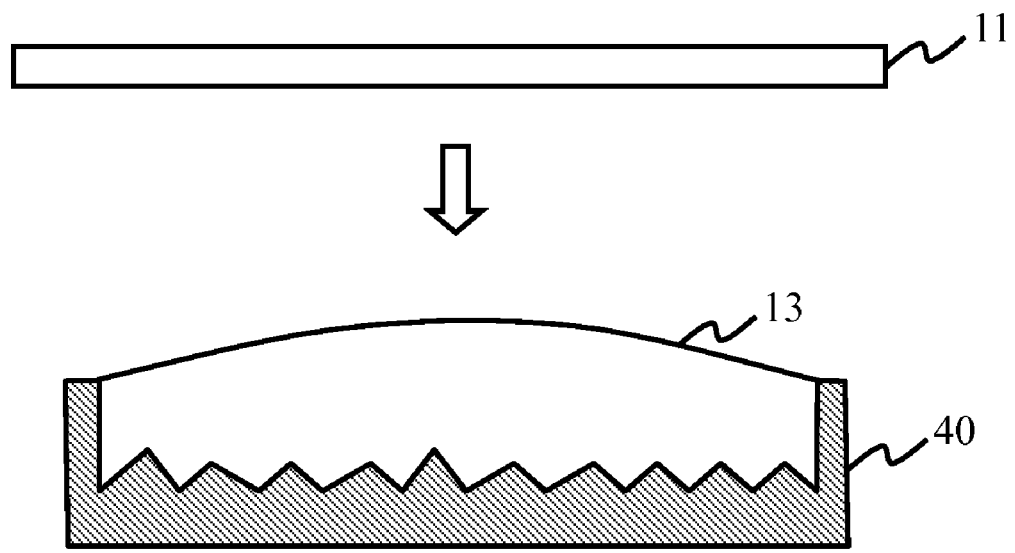
FIGS. 2A to 2C are the schematic diagrams relating to the steps of manufacturing silicone glass concentrator lens of a concentrator type solar cell module according to the prior art.
Figure 2B:
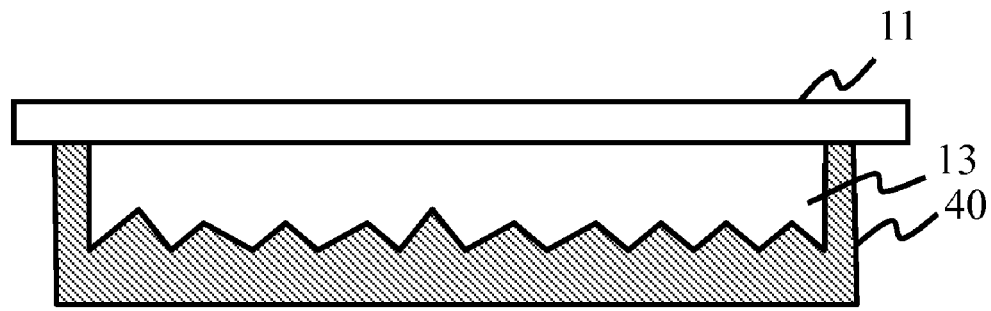
Figure 2C:
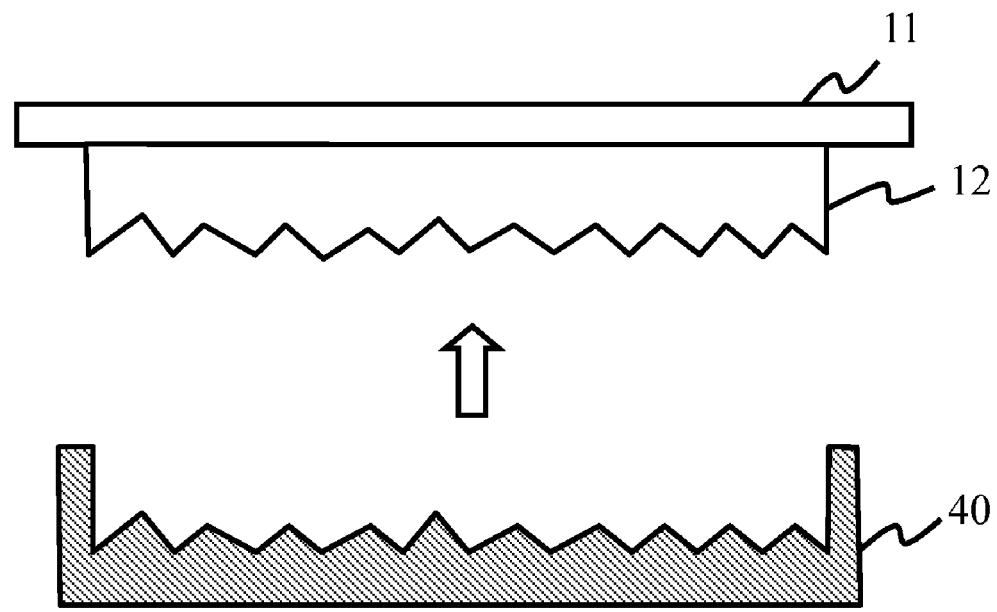
Figure 3D:
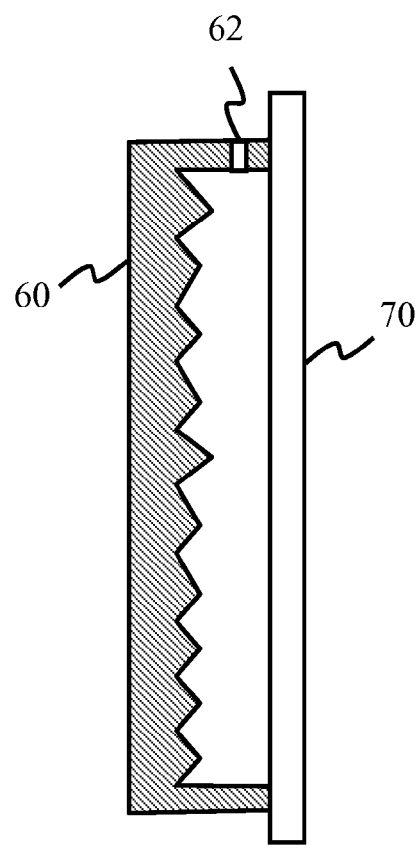
FIG. 3D is a schematic diagram relating to the steps of connecting the mold to a glass carrier plate in a silicone glass concentrator lens manufacturing process according to an embodiment of the present invention; and it is also a side cross section view of the mold and the glass carrier plate.

Then, as shown in FIG. 3D, connecting the mold 60 to a glass carrier plate 70, so as to form a mold cavity space between the mold 60 and the glass carrier plate 70, such that the mold 60 and the glass carrier plate 70 are in a vertical left-right juxtaposition configuration, instead of in an up-and-down configuration of the mold 40 and glass carrier plate 11 as in the prior art (refer to FIG. 2B).

Figure 3E:
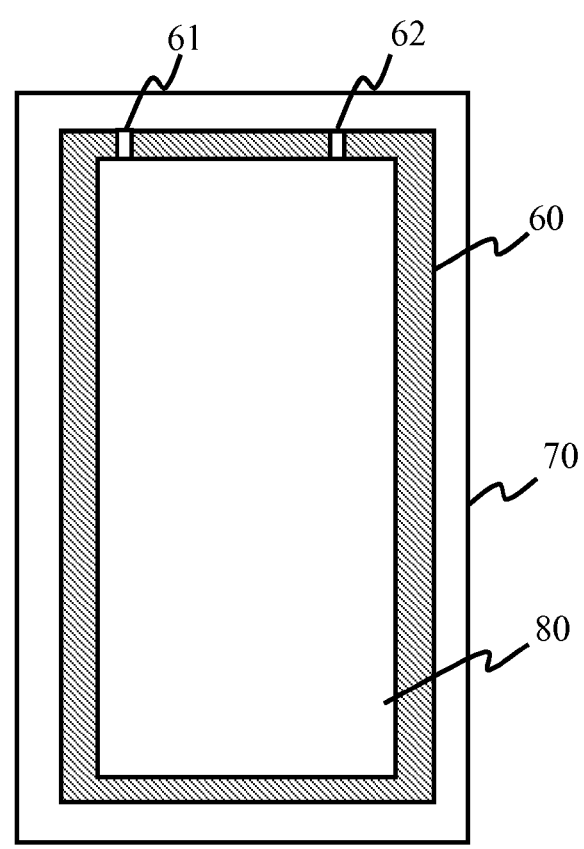
FIG. 3E is a schematic diagram relating to the step of pouring liquid silicone into a mold in a silicone glass concentrator lens manufacturing process according to an embodiment of the present invention; and it is also a front cross section view of the mold and the glass carrier plate.

Subsequently, as shown in FIG. 3E, pouring the liquid silicone 80 into the mold 60 through the material inlet hole 61, such that the mold cavity space is filled up with the liquid silicone 80. Meanwhile, the excessive air will be exited through the air outlet hole 62 automatically.

Figure 3F:
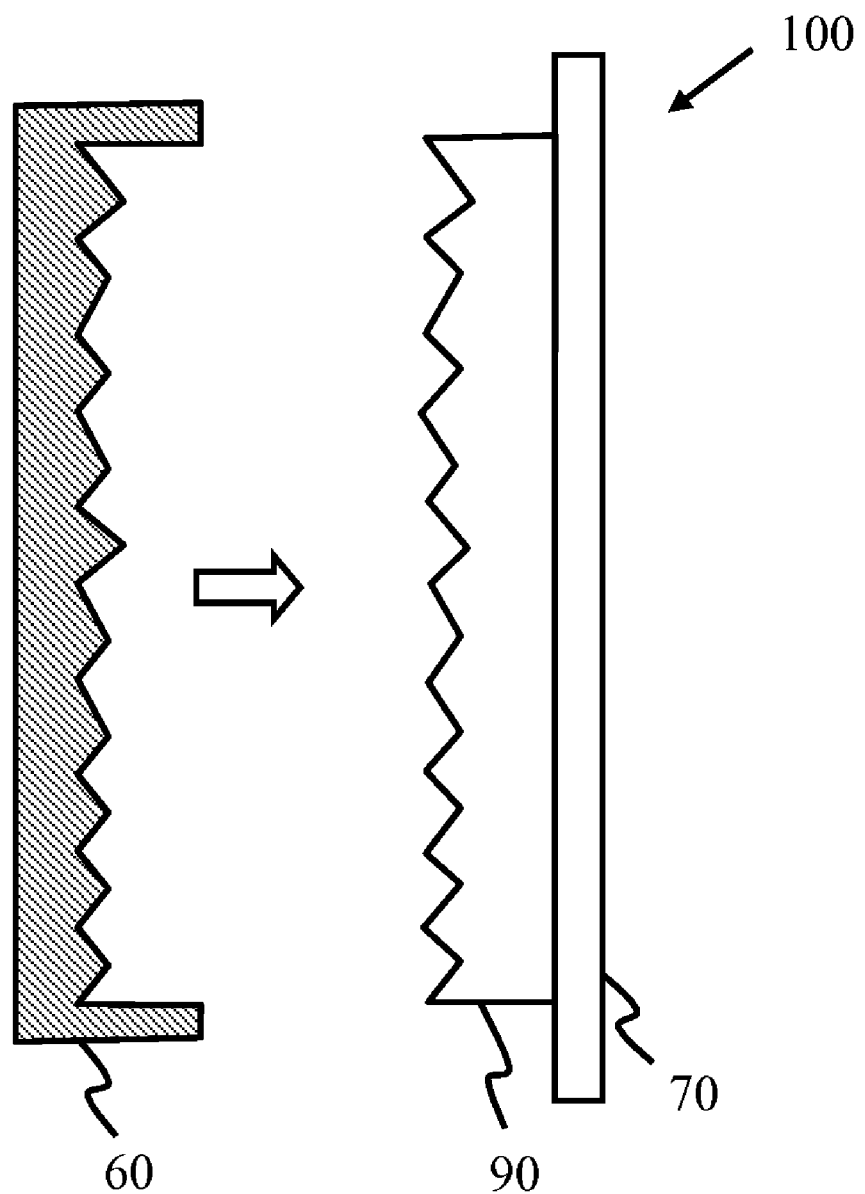
FIG. 3F is a schematic diagram relating to the step of after drying up the liquid silicone into mold, then taking off the mold to obtain a silicone glass concentrator lens, in a silicone glass concentrator lens manufacturing process according to an embodiment of the present invention.

Finally, as shown in FIG. 3F, waiting until the liquid silicone 80 is dried up to mold in becoming a silicone lens 90, then taking off the mold 60, thus realizing a bubble-free silicone glass concentrator lens 100. As such, the liquid silicone 80 can be formed into a Fresnel lens or a convex lens.

Through the application of the manufacturing process of silicone glass concentrator lens of the present invention, wherein, the mold is provided with a material inlet hole and an air outlet hole, and the mold and glass carrier plate are disposed in a vertical juxtaposition configuration for pouring in liquid silicone, such that after pouring in liquid silicone, excessive air can be exited from the mold through the air outlet hole automatically, thus, there is no need to add additional tools or to evacuate the air from the mold in advance. Also, in this way, air bubbles are not liable to occur after curing of the liquid silicone, and overflow of liquid silicone will not occur in the manufacturing process. As such, there is no need to remove the overflowed silicone, thus this will not damage the outer appearance of the silicone glass concentrator lens. Therefore, through the application of the present invention, the quality of the product and manufacturing efficiency can be raised effectively, while reducing the production cost.

The above detailed description of the preferred embodiment is intended to describe more clearly the characteristics and spirit of the present invention. However, the preferred embodiments disclosed above are not intended to be any restrictions to the scope of the present invention. Conversely, its purpose is to include the various changes and equivalent arrangements which are within the scope of the appended claims.

What is claimed is:

1. A manufacturing process of silicone glass concentrator lens, comprising the following steps:
   providing a mold, that is provided with a material inlet hole and an air outlet hole;
   connecting said mold to a glass carrier plate to form a mold cavity space, such that said mold and said glass carrier plate are in a vertical juxtaposition configuration;
   pouring liquid silicone into said mold through said material inlet hole, so as to fill up said mold cavity space with said liquid silicone and exit air through said air outlet hole automatically; and
   waiting for said liquid silicone to dry up that forms a silicone lens inside the mold, then taking a silicone glass concentrator lens off the mold, wherein the silicone glass concentrator lens is formed by a silicon lens attached to the glass carrier plate.

2. The manufacturing process of silicone glass concentrator lens as claimed in claim 1, wherein said material inlet hole is located in an upper portion of said mold.

3. The manufacturing process of silicone glass concentrator lens as claimed in claim 1, wherein said material inlet hole is located on a side of said mold.

4. The manufacturing process of silicone glass concentrator lens as claimed in claim 1, wherein said air outlet hole is located in an upper portion of said mold.

5. The manufacturing process of silicone glass concentrator lens as claimed in claim 1, wherein said liquid silicone is formed into a Fresnel lens.

6. The manufacturing process of silicone glass concentrator lens as claimed in claim 1, wherein said liquid silicone is formed into a convex lens.

7. The manufacturing process of silicone glass concentrator lens as claimed in claim 1, wherein, in said step of connecting said mold and said glass carrier plate vertically, said mold and said glass carrier plate are disposed in a vertical left-right juxtaposition configuration.

* * * * *